(12) United States Patent
Son et al.

(10) Patent No.: US 7,767,505 B2
(45) Date of Patent: Aug. 3, 2010

(54) METHODS OF MANUFACTURING AN OXIDE SEMICONDUCTOR THIN FILM TRANSISTOR

(75) Inventors: Kyoung-seok Son, Seoul (KR); Sang-yoon Lee, Seoul (KR); Myung-kwan Ryu, Yongin-si (KR); Tae-sang Kim, Seoul (KR); Jang-yeon Kwon, Seongnam-si (KR); Kyung-bae Park, Seoul (KR); Ji-sim Jung, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/153,651

(22) Filed: May 22, 2008

(65) Prior Publication Data
US 2009/0142887 A1 Jun. 4, 2009

(30) Foreign Application Priority Data
Dec. 3, 2007 (KR) .................. 10-2007-0124383

(51) Int. Cl.
*H01L 21/84* (2006.01)
(52) U.S. Cl. .............................. 438/158; 257/E21.561
(58) Field of Classification Search ......... 438/151–166; 257/E21.561
See application file for complete search history.

(56) References Cited

U.S. PATENT DOCUMENTS

| | | |
|---|---|---|
| 2001/0032986 A1 | 10/2001 | Miyasaka |
| 2006/0086976 A1 | 4/2006 | Mardilovich et al. |
| 2006/0110867 A1 | 5/2006 | Yabuta et al. |
| 2006/0113539 A1 | 6/2006 | Sano et al. |
| 2007/0194379 A1 | 8/2007 | Hosono et al. |

FOREIGN PATENT DOCUMENTS

EP  1209748  11/2001

OTHER PUBLICATIONS

European Search Report dated Aug. 21, 2008 in corresponding European Application No. 08157960.9-1528.

*Primary Examiner*—Richard A. Booth
(74) *Attorney, Agent, or Firm*—Harness, Dickey & Pierce, P.L.C.

(57) ABSTRACT

Methods of manufacturing an oxide semiconductor thin film transistor are provided. The methods include forming a gate on a substrate, and a gate insulating layer on the substrate to cover the gate. A channel layer, which is formed of an oxide semiconductor, may be formed on the gate insulating layer. Source and drain electrodes may be formed on opposing sides of the channel layer. The method includes forming supplying oxygen to the channel layer, forming a passivation layer to cover the source and drain electrodes and the channel layer, and performing an annealing process after forming the passivation layer.

9 Claims, 8 Drawing Sheets

METHODS OF MANUFACTURING AN OXIDE SEMICONDUCTOR THIN FILM TRANSISTOR

PRIORITY STATEMENT

This application claims the benefit of priority under 35 U.S.C. §119 from Korean Patent Application No. 10-2007-0124383, filed on Dec. 3, 2007, in the Korean Intellectual Property Office, the disclosure of which is incorporated herein in its entirety by reference.

BACKGROUND

1. Field

Example embodiments relates to methods of manufacturing a thin film transistor. Other example embodiments relate to methods of manufacturing a thin film transistor including an oxide semiconductor as a channel material.

2. Description of the Related Art

Because an oxide semiconductor may have a substantially high carrier density, a thin film transistor having the oxide semiconductor is usually operated in a depletion mode (i.e., a state where a substantially high current flows at a gate voltage of 0 V). As such, in order to turn off an oxide semiconductor thin film transistor, a larger negative gate voltage may be needed. In order to realize a display device having lower power consumption, a threshold voltage approaching a positive value may be desirable.

The oxide semiconductor may have a substantially high carrier density due to an oxygen deficiency in the oxide semiconductor, which leads to an excessive supply of carriers. As such, the electrical characteristics of the oxide semiconductor may be easily changed (or influenced) by external factors (e.g., plasma damage and water or oxygen absorbed in the oxide semiconductor). In order to realize a more stable and more reliable oxide semiconductor thin film transistor, a passivation layer that blocks external factors may be desirable.

A silicon oxide layer may be used as a passivation layer in a conventional oxide semiconductor because oxygen supplied from deposition of the silicon oxide layer suppresses the generation of excessive carriers in an oxide semiconductor. As such, the threshold voltage of the thin film transistor may be maintained within a desirable range.

A silicon oxide layer, opposed to a silicon nitride layer, may be desirable as a passivation layer against external factors (e.g., water or oxygen). A silicon nitride layer may have more functionality as a passivation layer, but does not contain oxidative ions. A substantially high leakage current may be generated by deoxidation of the oxide semiconductor due to a substantially large amount of hydrogen.

SUMMARY

Example embodiments relates to methods of manufacturing a thin film transistor. Other example embodiments relate to methods of manufacturing a thin film transistor including an oxide semiconductor as a channel material.

According to example embodiments, there is provided a method of manufacturing an oxide semiconductor thin film transistor, the method including forming a gate on a substrate, and forming a gate insulating layer on the substrate to cover the gate. A channel layer, which is formed of an oxide semiconductor, may be formed on the gate insulating layer. Source and drain electrodes may be formed on both (or opposing) sides of the channel layer. A plasma process for supplying oxygen to the channel layer may be performed. A passivation layer may be formed covering the source and drain electrodes and the channel layer. An annealing process may be performed, after forming the passivation layer.

The oxide semiconductor may include an oxide compound selected from the group consisting of zinc oxide, tin oxide, Ga—In—Zn oxide, In—Zn oxide, In—Sn oxide and combinations thereof. The oxide compound may be doped with at least one metal selected from the group consisting of aluminum (Al), nickel (Ni), copper (Cu), tantalum (Ta), hafnium (Hf), titanium (Ti) and combinations thereof.

A gas used in the plasma process may include oxygen ions. The plasma process may be an $N_2O$ plasma process.

The passivation layer may be one selected from the group consisting of a silicon oxide layer, a silicon nitride layer and an organic insulating layer.

The annealing process may be performed at a temperature of approximately 150° C.-500° C.

According to example embodiments, there is provided a method of manufacturing an oxide semiconductor thin film transistor, the method including forming a gate on a substrate, and a gate insulating layer on the substrate to cover the gate. A channel layer, which is formed of an oxide semiconductor, may be formed on the gate insulating layer. Source and drain electrodes may be formed on both (or opposing) sides of the channel layer. A passivation layer may be formed covering the source and drain electrodes and the channel layer. Ions containing oxygen may be injected into the channel layer. An annealing process may be performed, after the ion injection process.

The ion injection process may be performed by injecting ions containing oxygen to the channel layer through the passivation layer using an ion injection apparatus. As such, the density of the oxygen ions may increase between the passivation layer and the channel layer in the ion injection process.

BRIEF DESCRIPTION OF THE DRAWINGS

Example embodiments will be more clearly understood from the following detailed description taken in conjunction with the accompanying drawings. FIGS. 1-12 represent non-limiting, example embodiments as described herein.

FIGS. 1 through 6 are schematic views illustrating a method of manufacturing an oxide semiconductor thin film transistor according to example embodiments;

FIG. 8 illustrates variation in a threshold voltage of an oxide semiconductor thin film transistor according to example embodiments in accordance with the process time of $N_2O$ plasma treatment; and FIGS. 9 through 12 are schematic views illustrating a method of manufacturing an oxide semiconductor thin film transistor according to example embodiments.

DETAILED DESCRIPTION OF EXAMPLE EMBODIMENTS

Figure 1:
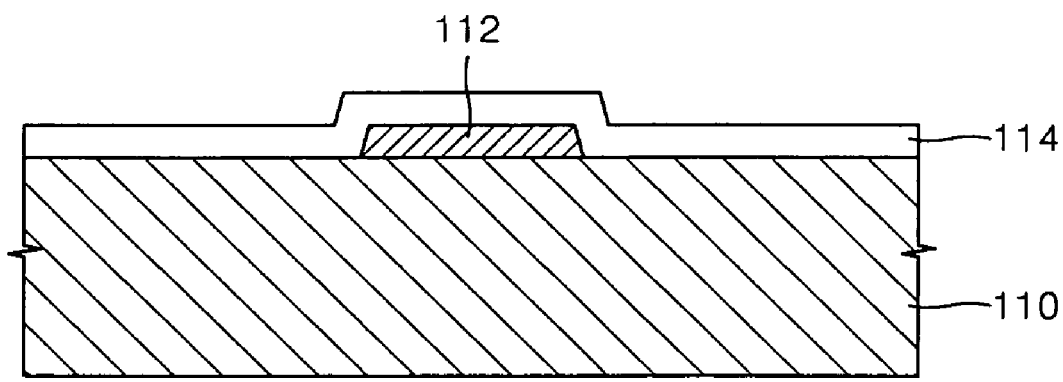

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relates to methods of manufacturing a thin film transistor. Other example embodiments relate to methods of manufacturing a thin film transistor including an oxide semiconductor as a channel material.

FIGS. 1 through 6 are schematic views illustrating a method of manufacturing an oxide semiconductor thin film transistor according to example embodiments.

Referring to FIG. 1, a gate 112 may be formed on a substrate 110. The substrate 110 may be a silicon substrate, a glass substrate, a plastic substrate or the like. The gate 112 may be formed by depositing a desired metal on the substrate 110 and patterning the same. A gate insulating layer 114 may be formed on the substrate 110 to cover the gate 112. The gate insulating layer 114 may be formed of a silicon oxide, a silicon nitride or the like. However, example embodiments are not limited thereto.

Figure 2:
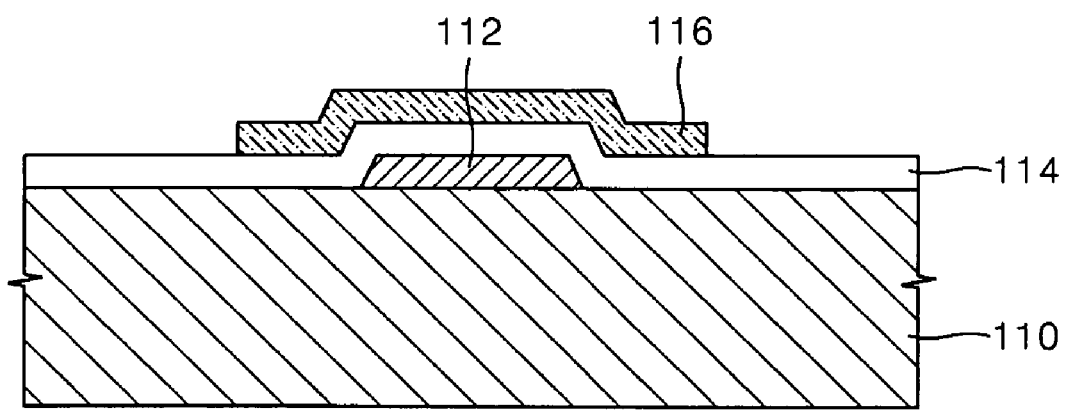

Referring to FIG. 2, a channel layer 116 may be formed on the gate insulating layer 114 to correspond to the gate 112. The channel layer 116 may be formed of a transparent oxide semiconductor. Examples of the oxide semiconductor include, but are not limited to, zinc oxide, tin oxide, Ga—In—Zn oxide, In—Zn oxide, In—Sn oxide and combinations thereof. The oxide semiconductor may be doped with at least one selected form the group consisting of aluminum (Al), nickel (Ni), copper (Cu), tantalum (Ta), hafnium (Hf), titanium (Ti) and combinations thereof. The channel layer 116 may be formed by depositing the oxide semiconductor on the gate insulating layer 114 using a physical vapor deposition (PVD) method (e.g., sputtering or evaporation) and patterning the same.

Figure 3:
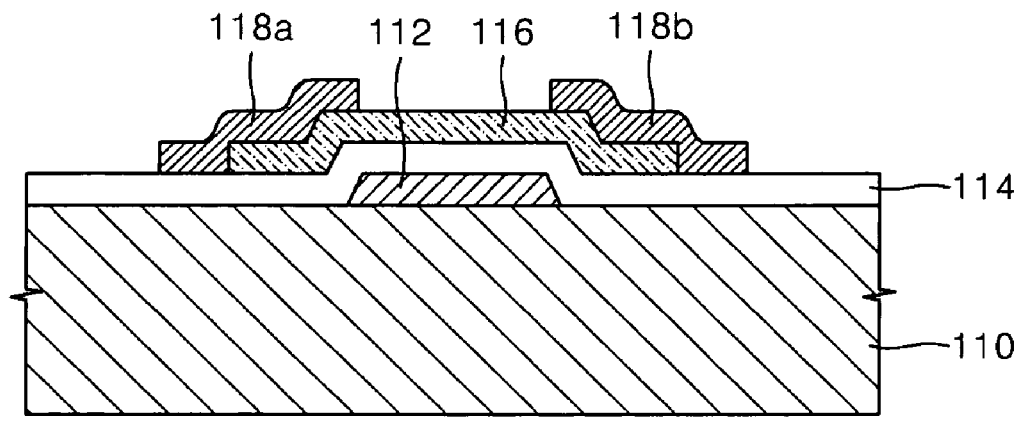

Referring to FIG. 3, source and drain electrodes 118a and 118b may be formed on both (or opposing) sides of the channel layer 116. The source and drain electrodes 118a and 118b may be formed by depositing a desired metal layer to cover the channel layer 116 and patterning the same. The metal layer may have a single-layer structure or a multiple-layer structure. The metal layer may be formed of a metal selected from the group consisting of copper (Cu), molybdenum (Mo), aluminum (Al) and combinations thereof. However, example embodiments are not limited thereto.

Figure 4:
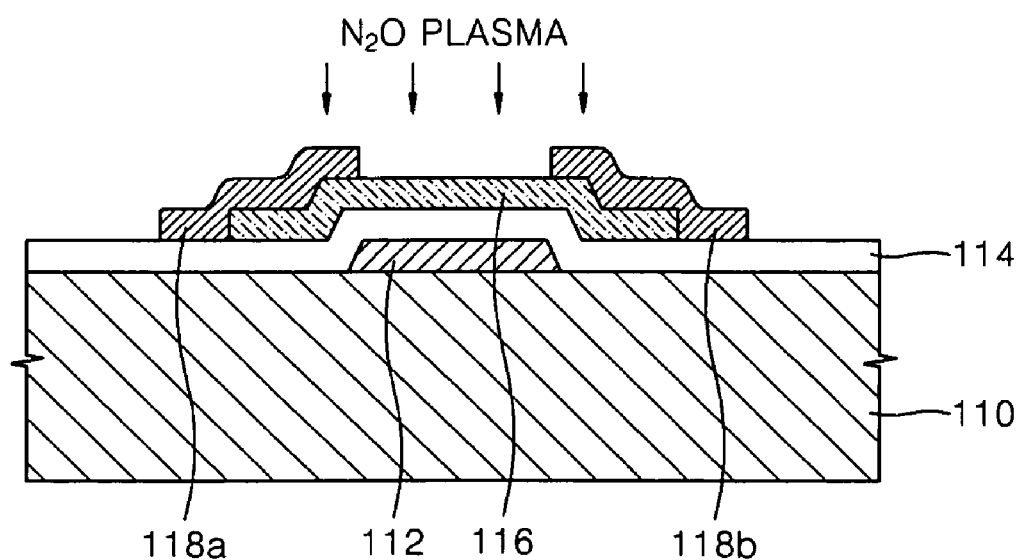

Referring to FIG. 4, a plasma process may be performed to supply oxygen to the channel layer 116. A gas, which includes oxygen ions, may be used in the plasma process. For example, N$_2$O may be used in the plasma process. Oxygen may be supplied to a surface of the channel layer 116 by the N$_2$O plasma process.

Figure 5:
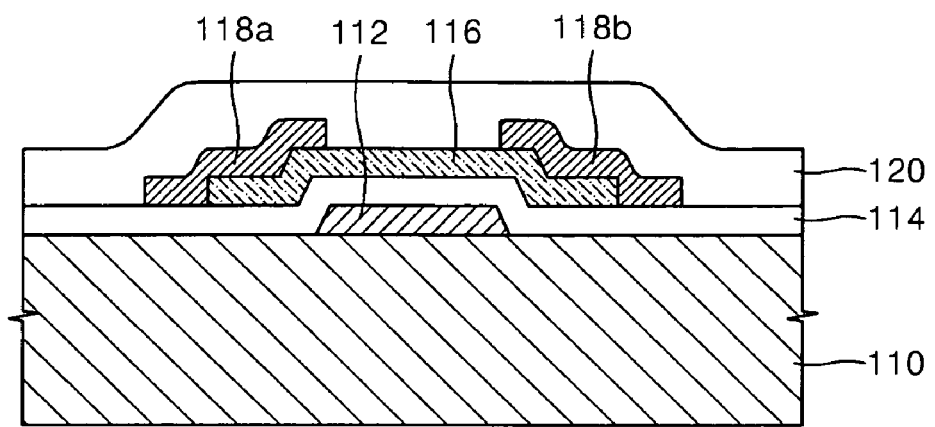

Referring to FIG. 5, a passivation layer 120 may be formed to cover the source and drain electrodes 118a and 118b and the channel layer 116 on the gate insulating layer 114. The passivation layer 120 may be a silicon oxide layer, a silicon nitride layer or an organic insulating layer. The passivation layer 120 may be formed by depositing at least one of the silicon oxide layer, silicon nitride layer and the organic insulating layer on the gate insulating layer 114. The passivation layer 120 may be deposited having a desired thickness.

Figure 6:
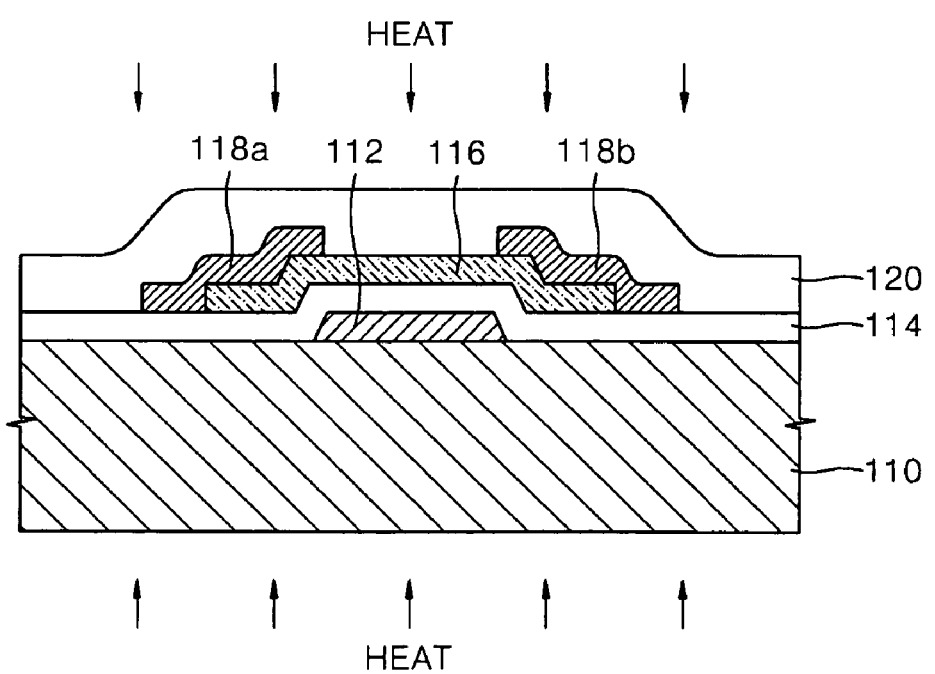

Referring to FIG. 6, an annealing process may be performed on the resultant structure illustrated in FIG. 5. Oxygen, which is supplied during the plasma process to the channel layer 116 formed of the oxide semiconductor, may be activated so as to form oxygen bonds inside the channel layer 116. If oxygen inside the channel layer 116 is activated, generation of excessive carriers due to oxygen scarcity may be suppressed. As such, a threshold voltage of the thin film transistor may be maintained within a desired range. The annealing process may be performed at about 150° C.-500° C. The annealing process may be performed at approximately 150° C.-400° C.

An oxide semiconductor may have a substantially high carrier density because oxygen scarcity in the oxide semiconductor leads to an excessive supply of carriers. As such, in order to turn off a thin film transistor having a channel layer formed of an oxide semiconductor, a substantially large negative gate voltage is needed.

If oxygen is supplied between the channel layer 116 and the passivation layer 120 by the plasma process in accordance with example embodiments and the oxygen is activated so as to form oxygen bonds inside the channel layer 116 formed of the oxide semiconductor, the threshold voltage may increase to (or approach) a more positive value.

Figure 7A:
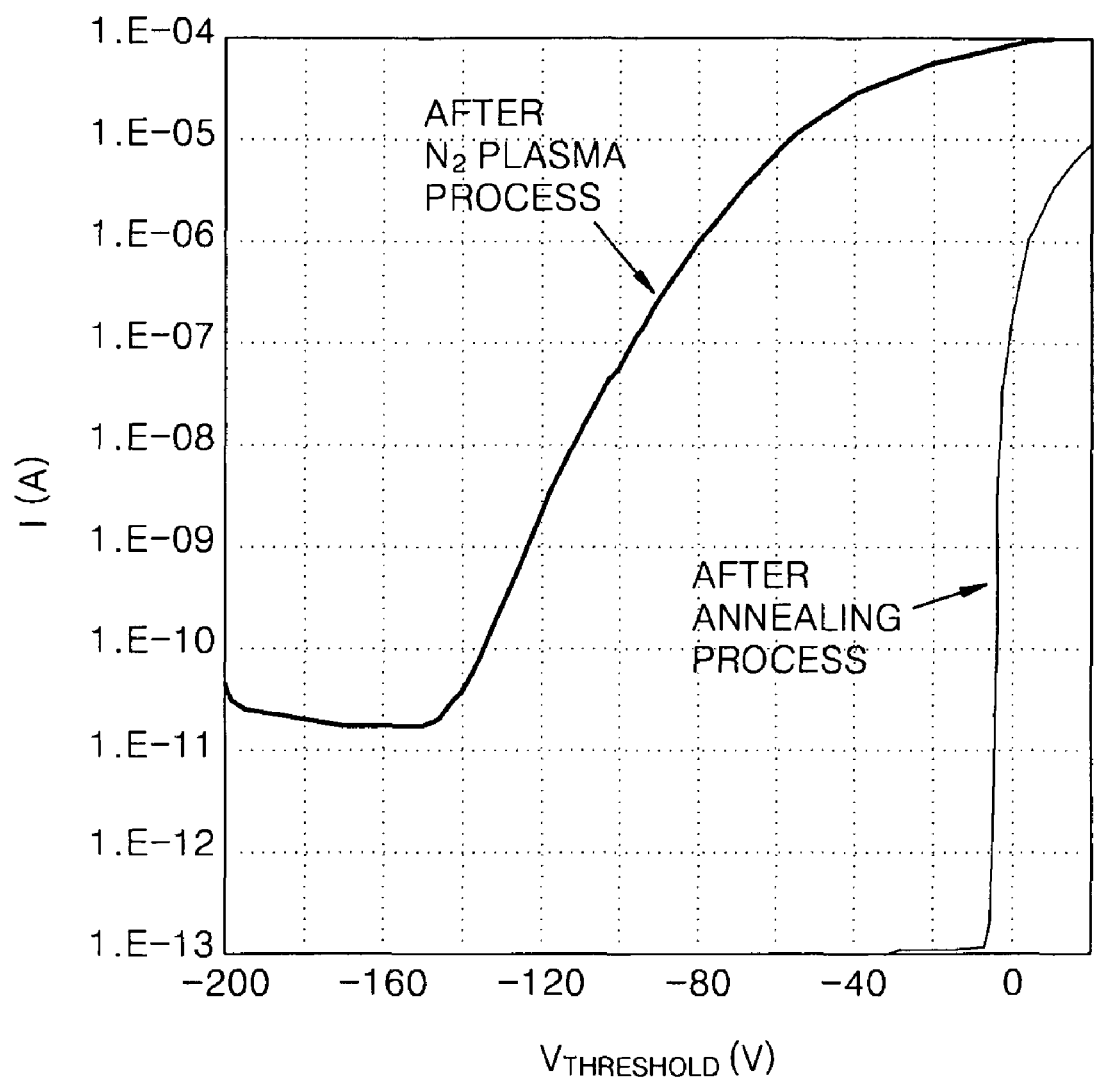
FIG. 7A shows graphs showing a current-voltage (I-V) characteristic of an oxide semiconductor thin film transistor after an $N_2$ plasma process and an annealing process are sequentially performed according to an comparative example.
Figure 7B:
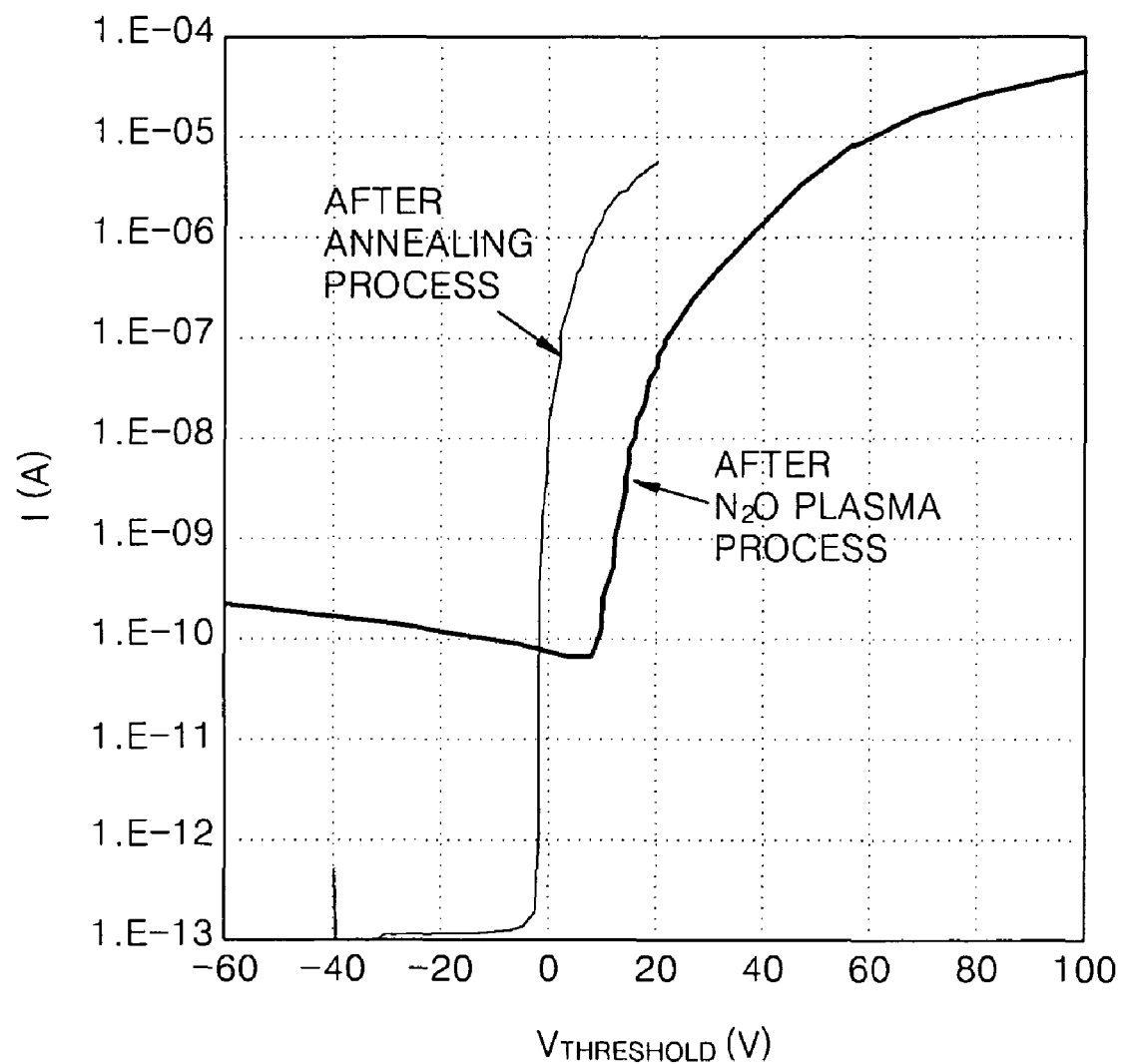
FIG. 7B shows graphs showing a current-voltage (I-V) characteristic of an oxide semiconductor thin film transistor after an $N_2O$ plasma process and an annealing process are sequentially performed according to an comparative example.

FIG. 7A illustrates graphs showing a current-voltage (I-V) characteristic of an oxide semiconductor thin film transistor after an N$_2$ plasma process and an annealing process are sequentially performed in an comparative example. FIG. 7B illustrates graphs showing a current-voltage (I-V) characteristic of an oxide semiconductor thin film transistor after a N$_2$O plasma process and an annealing process are sequentially performed in an comparative example.

In FIGS. 7A and 7B, the oxide semiconductor thin film transistor does not include a passivation layer.

Referring to FIG. 7A, after performing an N$_2$ plasma process and before performing an annealing process, a threshold voltage V$_{threshold}$ may reach a substantially large negative value because the N$_2$ plasma process destroys oxygen bonds inside a channel layer formed of an oxide semiconductor. As such, an oxygen deficiency may be generated, which may cause excessive generation of carriers. After performing the annealing process at about 200° C. for approximately an hour, the threshold voltage V$_{threshold}$ reaches a positive value. As such, the oxide semiconductor thin film transistor may exhibit similar characteristics as those prior to performing the N$_2$ plasma process because oxygen bonds destroyed by the N$_2$ process may be restored by performing the annealing process and the amount (or number) of carriers decreases.

Referring to FIG. 7B, the threshold voltage V$_{threshold}$ reaches a substantially large positive value after performing an N$_2$O plasma process and prior to performing an annealing process. As such, the slope of the threshold voltage V$_{threshold}$ decreases in comparison to FIG. 7A. The threshold voltage V$_{threshold}$ may reach a substantially large positive value after performing an N$_2$O plasma process and prior to performing an annealing process because, if the oxide semiconductor is damaged by the N$_2$O plasma process, the carrier density decreases according to the amount of the supplied oxygen ions. After an annealing process is performed at about 200° C. for an hour, the threshold voltage V$_{threshold}$ may reach a negative value and the slope of the threshold voltage V$_{threshold}$ increases. As such, the thin film transistor may exhibit similar characteristics as those observed prior to performing the N$_2$O plasma process. The change in characteristics of the thin film transistor may be due to detachment of oxygen that is supplied during the annealing process. If no passivation layer, which prevents (or reduces) detachment of oxygen, is formed, the threshold voltage V$_{threshold}$ may not change although oxygen is supplied into the channel layer formed of an oxide semiconductor.

Figure 8:
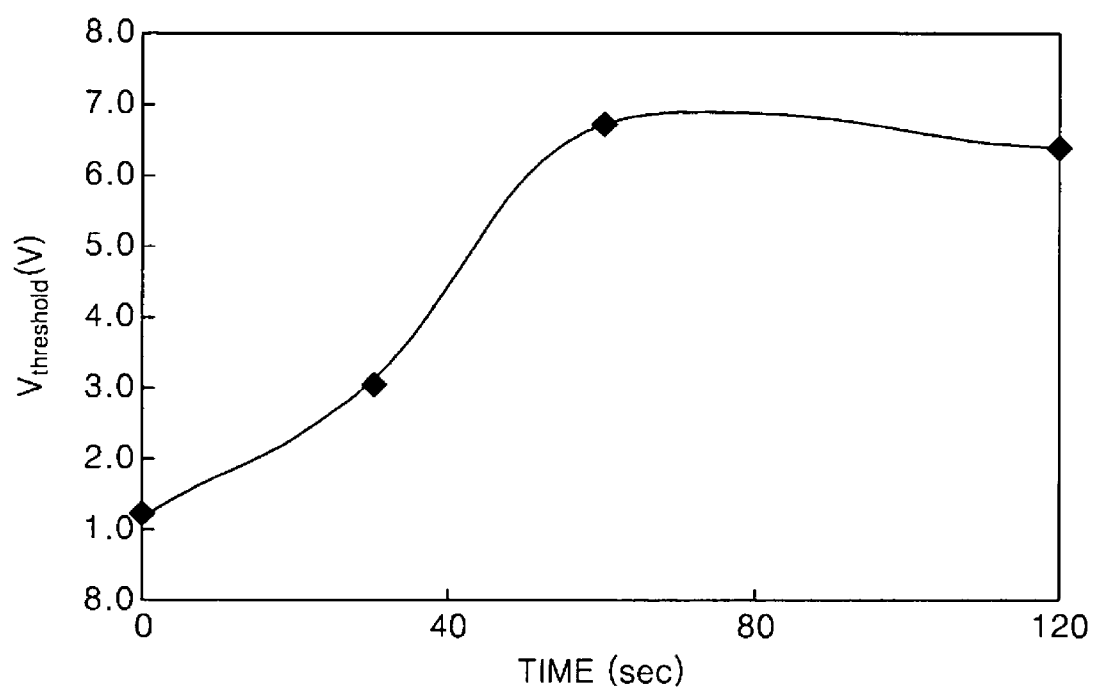

FIG. 8 illustrates variation of a threshold voltage V$_{threshold}$ of an oxide semiconductor thin film transistor in accordance the process time of N$_2$O plasma treatment according to example embodiments.

In FIG. 8, an N$_2$O plasma process, formation of a silicon oxide passivation layer and an annealing process were sequentially performed.

Referring to FIG. 8, the threshold voltage V$_{threshold}$ of the oxide semiconductor thin film transistor increases with a positive voltage after the annealing process. The threshold voltage V$_{threshold}$ increases for about 60 seconds.

FIGS. 9 through 12 are schematic views illustrating a method of manufacturing an oxide semiconductor thin film transistor according to example embodiments.

Figure 9:
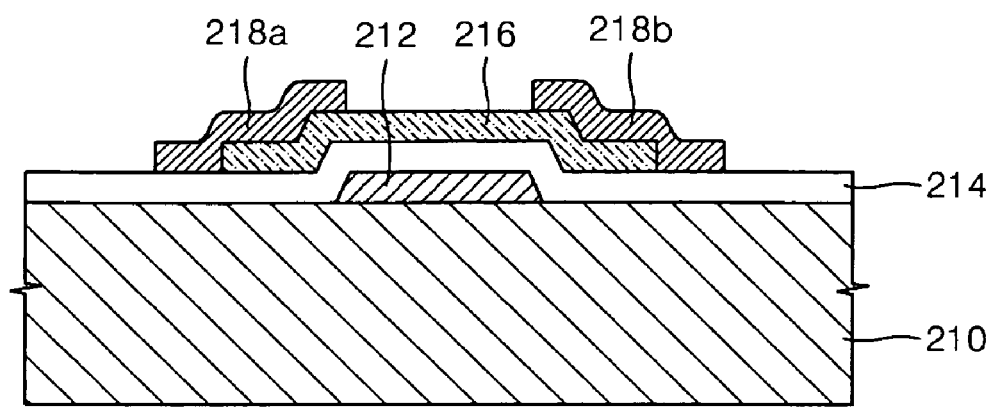

Referring to FIG. 9, a gate 212 may be formed on a substrate 210. A gate insulating layer 214 may be formed to cover the gate 212. The gate 212 may be formed by depositing a desired metal on the substrate 210 and patterning the same. The gate insulating layer 214 may be formed of a silicon oxide or a silicon nitride.

A channel layer 216 may be formed on the gate insulating layer 214 to correspond to the gate 212. The channel layer 216 may be formed of a transparent oxide semiconductor. Examples of the oxide semiconductor include zinc oxide, tin oxide, Ga—In—Zn oxide, In—Zn oxide, In—Sn oxide and combinations thereof. The oxide semiconductor may be doped with at least one metal selected from the group consisting of aluminum (Al), nickel (Ni), copper (Cu), tantalum (Ta), hafnium (Hf), titanium (Ti) and combinations thereof. However, example embodiments are not limited hereto. Source and drain electrodes 218a and 218b may be formed on both (or opposing) sides of the channel layer 216. The source and drain electrodes 218a and 218b may be formed by forming a desired metal layer to cover the channel layer 216 and patterning the same.

Figure 10:
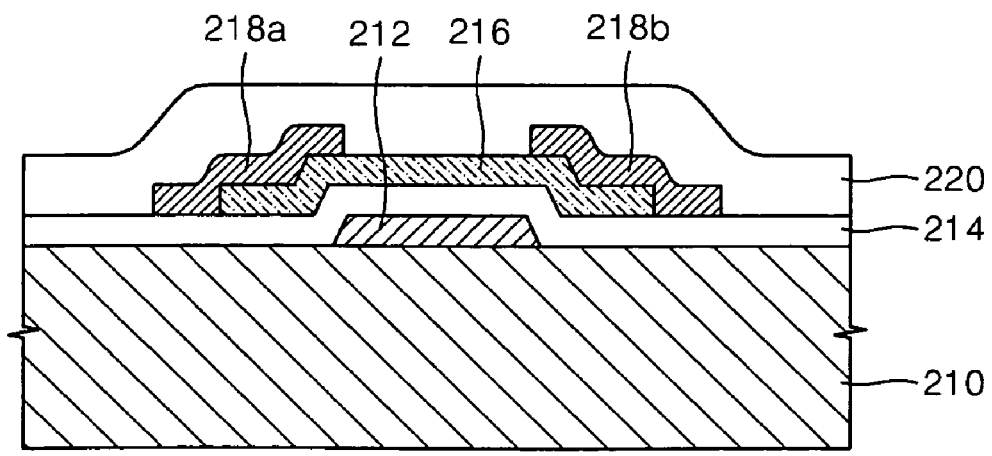

Referring to FIG. 10, a passivation layer 220 may be formed on the gate insulating layer 214 to cover the source and drain electrodes 218a and 218b and the channel layer 216. The passivation layer 220 may be a silicon oxide layer, a silicon nitride layer, an organic insulating layer or the like.

Figure 11:
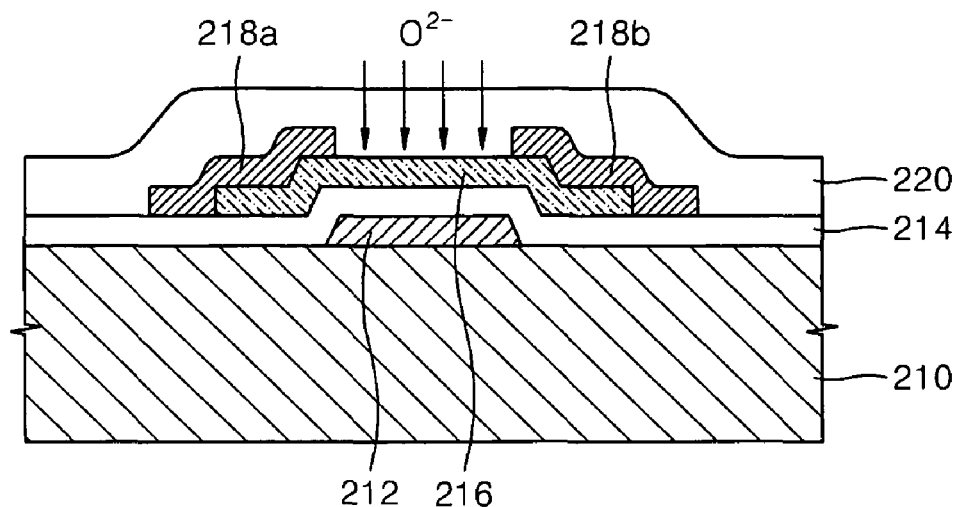

Referring to FIG. 11, after forming the passivation layer 220, ions containing oxygen may be injected into the channel layer 216 formed of an oxide semiconductor. The ion injection process may be performed by injecting ions containing oxygen to the channel layer 216 through the passivation layer 220 using an ion injection apparatus. The acceleration energy of the ion injection apparatus may be adjusted so that the density of ions may increase between the passivation layer 220 and the channel layer 216.

Figure 12:
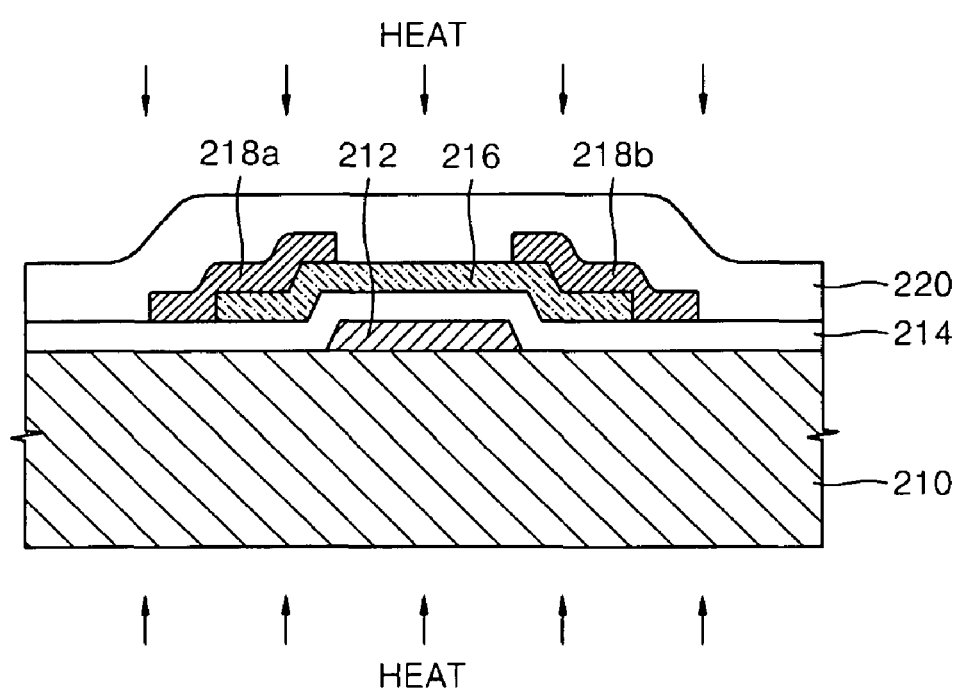

Referring to FIG. 12, an annealing process may be performed on the resultant product of FIG. 11. The annealing process may be performed at a temperature of about 150°

C.-500° C. The annealing process may be performed at a temperature of about 150° C.-400° C. The annealing process may be known in the art.

The annealing process may fix (or repair) the damage generated during the ion injection process (i.e., the destruction of oxygen bonds generated in the channel layer 216 formed of the oxide semiconductor). As such, the carrier density decreases in the channel layer 216 and the threshold voltage of the oxide semiconductor thin film transistor increases to a more positive value.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of manufacturing an oxide semiconductor thin film transistor, the method comprising:
    forming a gate on a substrate;
    forming a gate insulating layer on the substrate such that the gate insulating layer covers the gate;
    forming a channel layer on the gate insulating layer, the channel layer being formed of an oxide semiconductor;
    forming source and drain electrodes on opposing sides of the channel layer;
    forming a passivation layer that covers the source and drain electrodes and the channel layer;
    injecting a plurality of oxygen-containing ions into the channel layer after forming the passivation layer; and
    annealing the oxide semiconductor thin film transistor after forming the passivation layer and injecting the oxygen-containing ions.

2. The method of claim 1, wherein the oxide semiconductor is an oxide compound selected from the group consisting of zinc oxide, tin oxide, Ga—In—Zn oxide, In—Zn oxide, In—Sn oxide and combinations thereof.

3. The method of claim 2, wherein the oxide compound is doped with at least one selected from the group consisting of aluminum (Al), nickel (Ni), copper (Cu), tantalum (Ta), hafnium (Hf), titanium (Ti) and combinations thereof.

4. The method of claim 1, wherein the oxygen-containing ions are injected through the passivation layer using an ion injection apparatus.

5. The method of claim 4, wherein injecting the oxygen-containing ions substantially increases a density of the oxygen-containing ions between the passivation layer and the channel layer.

6. The method of claim 1, wherein injecting the oxygen-containing ions substantially increases a density of the oxygen-containing ions between the passivation layer and the channel layer.

7. The method of claim 1, wherein the passivation layer is at least one selected from the group consisting of a silicon oxide layer, a silicon nitride layer and an organic insulating layer.

8. The method of claim 1, wherein annealing is performed at a temperature of approximately 150° C.-500° C.

9. The method of claim 8, wherein annealing is performed at a temperature of approximately 150° C.-400° C.

* * * * *